United States Patent
Trotter et al.

(10) Patent No.: US 6,940,437 B2
(45) Date of Patent: Sep. 6, 2005

(54) MULTIBIT DELTA-SIGMA MODULATOR WITH VARIABLE-LEVEL QUANTIZER

(75) Inventors: Brian David Trotter, Austin, TX (US); Bruce Eliot Duewer, Austin, TX (US)

(73) Assignee: Cirrus Logic, Inc., Austin, TX (US)

(*) Notice: Subject to any disclaimer, the term of this patent is extended or adjusted under 35 U.S.C. 154(b) by 97 days.

(21) Appl. No.: 10/699,466

(22) Filed: Oct. 31, 2003

(65) Prior Publication Data

US 2005/0093727 A1 May 5, 2005

(51) Int. Cl.[7] ............................................. H03M 3/00
(52) U.S. Cl. ........................................ 341/143; 341/152
(58) Field of Search ................................ 341/143, 152

(56) References Cited

U.S. PATENT DOCUMENTS

| | | |
|---|---|---|
| 6,331,833 B1 | 12/2001 | Naviasky et al. |
| 6,556,159 B1 | 4/2003 | Fei et al. |
| 2004/0160348 A1 * | 8/2004 | Hochschild ................. 341/143 |

* cited by examiner

*Primary Examiner*—Michael B. Shingleton
(74) *Attorney, Agent, or Firm*—Steven Lin; Jack V. Musgrove

(57) ABSTRACT

A method of operating a delta-sigma modulator by providing a variable-level quantizer, which selectively enables an additional quantizer level(s) during a ramp up sequence of the modulator. The additional quantizer level(s) is/are disabled during normal operation. The quantizer truncates a summer output and selectively enables the additional quantizer levels by clipping the truncated sum within a first range of quantizer levels during the ramp up sequence and within a second range of quantizer levels during normal operation in which there are more quantizer levels in the first range than in the second range. The quantizer preferably enables at least two additional quantizer levels at a low end of the quantizer range. For example, the range of quantizer levels for normal operation of the modulator can be from −6 to +6, while the range of quantizer levels for ramp up operation of the modulator can be from −8 to +7.

22 Claims, 4 Drawing Sheets

MULTIBIT DELTA-SIGMA MODULATOR WITH VARIABLE-LEVEL QUANTIZER

BACKGROUND OF THE INVENTION

1. Field of the Invention

The present invention generally relates to digital-to-analog converters, and more particularly, to a method of operating a multibit delta-sigma modulator in a digital-to-analog converter to enable smooth ramp-up when the digital-to-analog converter is first turned on.

2. Description of the Related Art

Digital-to-analog converters are used in a wide variety of digital signal processing (DSP) devices such as audio systems, programmable power supplies, and digitally controlled filters. A digital-to-analog converter is an electronic circuit that takes a digital input signal and uses logic elements to convert the digital signal into an analog output signal, which is further used to drive analog circuitry. For example, in an audio application, the analog output signal can be used to drive one or more speakers in a stereo system or alternatively a headphone of a portable music player such as an "MP3" player.

Early digital-to-analog converters (DACs) utilized resistive ladder networks, but most state-of-the-art DACs now utilize a "delta-sigma" modulator. A typical DAC 10 is illustrated in FIG. 1. A digital signal source 12 provides the primary input to the delta-sigma modulator 14. The digital signal source could be from, e.g., a digital radio receiver, an audio compact disc (CD), digital audio tape (DAT), a digital video disc (DVD) or a broadcast satellite. Delta-sigma modulator 14 feeds a multilevel noise-shaped signal based on the digital input stream to a back-end low-pass filter 18. This filter could be a discrete-time or continuous-time implementation. A continuous-time implementation may include a pulse-width modulation (PWM) encoder 16, which converts a multilevel delta-sigma output to one or more PWM bit streams. Low-pass filter 18 removes high frequencies from the output, and the filtered output then drives some other device such as a speaker 20.

A delta-sigma modulator is a circuit that translates a low-sample rate, high-resolution input into a high-sample rate, low-resolution output. This low-resolution output is then converted into a high-resolution analog signal by averaging it over time with the low-pass filter. The delta-sigma modulator generally involves two accumulator blocks in the circuit. The first block calculates the difference (delta) between two values (i.e., an error signal), and the second block accumulates the sum (sigma) of the error signal. Delta-sigma modulators are also useful in codec and similar mixed-signal applications.

A simplified delta-sigma modulator is shown in FIG. 2. The digital signal is a primary input into the delta accumulator 22, which further receives a feedback input. The output of delta accumulator 22 is the primary input to the sigma accumulator 24, which also receives a feedback input. The output of sigma accumulator 24 is fed to a latch 26, which is controlled by the clock signal. The output of latch 26 is an input to a quantizer 28 and is also the feedback input for accumulator 24. The purpose of the quantizer is to convert the high-resolution digital signal into a low-resolution representation, which can be accurately converted to an analog signal. The output of quantizer 28 is the output of delta-sigma modulator 14 and provides the input to the back-end filter.

The feedback loops in a delta-sigma modulator help reduce in-band quantization errors which cause distortion in the output signal. Oversampling is further employed with a delta-sigma modulator to spread the quantization noise power across an oversampling frequency band, which is typically much greater than the input signal bandwidth. Additionally, delta-sigma modulators perform noise shaping by acting as a high-pass filter to the noise such that most of the quantization noise power is shifted out of the signal band of interest. In a first order delta-sigma modulator, the linear filter comprises a single integrator stage, while the filter in a higher order modulator comprises a cascade of a corresponding number of integrator stages. Higher order modulators have the advantage of improved noise shaping capability over lower order modulators, but stability can become a problem as the order is increased.

During device power-up and power-down, a digital-to-analog system should produce no audible artifacts at its output. A problem, however, may exist for single-ended delta-sigma modulator DACs since the modulator cannot drive its output all the way to ground while remaining stable. It is possible to address this problem by driving the input of the delta-sigma modulator well below its nominal negative full-scale level, increasing the modulation index, and lowering the modulator order to maintain stability. The modulator input is then ramped from this low level to the common mode level, as discussed in U.S. Pat. No. 6,556,159 to Fei et al. entitled "Variable Order Modulator" which is incorporated by reference herein. Additionally, an analog gain stage can be used during ramp up to drive the output further toward ground. However, for DACs that utilize a PWM encoder as part of the back-end filter, constraints on the quantizer make this an incomplete solution.

These constraints relate to the requirement that a PWM system have an output stream with a constant edge rate. A system with a PWM encoder that does not have a constant edge rate will suffer from high distortion. For example, a PWM pulse width of eight clock cycles has nine possible values for this PWM pulse (0, 1, . . . 8) as shown in FIG. 2. However, to guarantee a constant edge rate (in this case, two edges per pulse), the first two cases (0,1) and last case (8) are not allowed, leaving only six allowed values for the pulse. If a delta-sigma quantizer is driving this PWM encoder, the quantizer is accordingly constrained to only those six legal values. This constraint on the quantizer output makes it difficult to achieve a high modulation index. PWM encoders are nevertheless desirable to use since the constant edge rate eliminates data dependent switching.

In light of the foregoing, it would be desirable to devise an improved delta-sigma modulator, which can take advantage of PWM encoding but still eliminate or reduce audible artifacts on power up. It would be further advantageous if a quantizer for such a delta-sigma modulator could be selectively modified to allow for a higher modulation index during ramp up.

SUMMARY OF THE INVENTION

It is therefore one object of the present invention to provide an improved digital-to-analog converter, which utilizes a delta-sigma modulator.

It is another object of the present invention to provide such a digital-to-analog converter, which utilizes pulse-width modulation encoding of the output of the delta-sigma modulator.

It is yet another object of the present invention to provide a digital-to-analog converter, which allows operation at variable quantizer levels to eliminate or reduce audible artifacts at power up.

The foregoing objects are achieved in a method of operating a multibit delta-sigma modulator, generally comprising the steps of generating a plurality of integrator outputs from an input signal, calculating a sum of signals chosen from the input and the integrator outputs, and deriving a quantized value from the sum, wherein the deriving step includes the step of selectively enabling an additional quantizer level during a ramp up sequence of the modulator. This additional quantizer level(s) is/are disabled during normal operation of the modulator. The quantized value can then be provided as an input to a pulse width modulation encoder, as part of a larger digital-to-analog converter system.

In the illustrative embodiment, the quantizer truncates the summer output and selectively enables the additional quantizer level(s) by clipping the truncated sum within a first range of quantizer levels during the ramp up sequence or within a second range of quantizer levels during normal operation in which there are more quantizer levels in the first range than in the second range. The quantizer preferably enables at least two additional quantizer levels at a low end of the quantizer range. For example, the range of quantizer levels for normal operation of the modulator can be from −6 to +6, while the range of quantizer levels for ramp up operation of the modulator can be from −8 to +7. In that fixed-point implementation the summer provides a 12-bit value, which is truncated to a 4-bit quantized value.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 4:
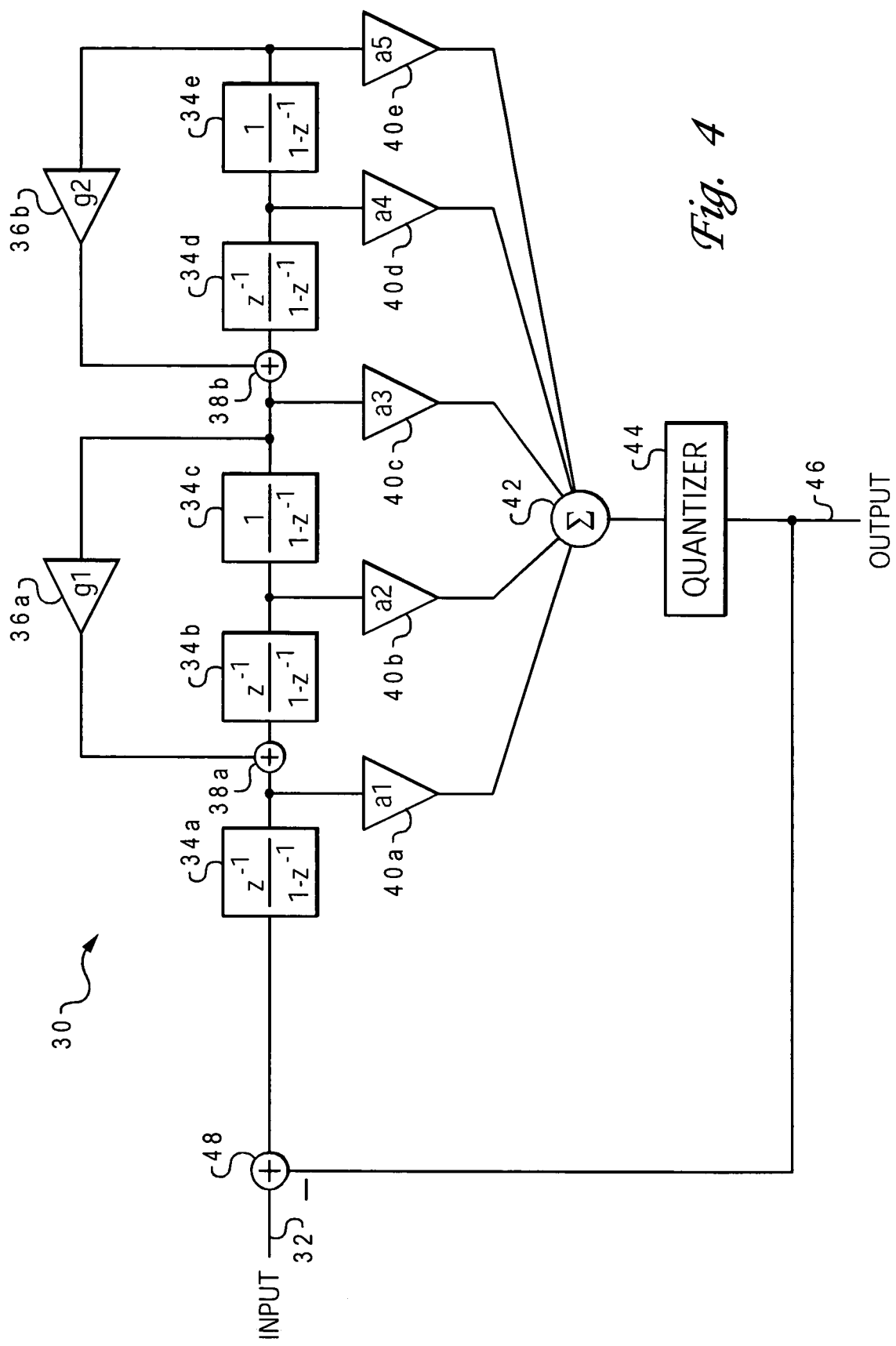
FIG. 4 is a schematic diagram of one embodiment of a delta-sigma modulator constructed in accordance with the present invention, adapted for use with a PWM encoder and having a variable-level quantizer.

With reference now to the figures, and in particular with reference to FIG. 4, one embodiment 30 of a delta-sigma modulator constructed in accordance with the present invention is depicted. The system shown is a $5^{th}$—order feedforward delta-sigma modulator, but the particular topology is shown only as one example. The principles of the invention can be applied to many different topologies as will become apparent to those skilled in the art upon reference to this disclosure. In an exemplary application, delta-sigma modulator 30 is used advantageously to feed an input of a pulse-width modulation (PWM) encoder in a 4-bit digital-to-analog converter (DAC). The multibit delta-sigma modulator employs a variable-width quantizer to allow operation at a high modulation index. This technique enables smooth ramp up on powerup while eliminating the rise and fall time asymmetry common in PWM DACs which can otherwise lead to distortion.

Delta-sigma modulator 30 generally has an input node 32, a series of integrators 34a, 34b, 34c, 34d, 34e connected to the input node, two gain stages 36a, 36b which provide feedback to adders 38a, 38b interposed between the integrators, and several buffers 40a, 40b, 40c, 40d, 40e, which respectively couple the outputs generated by the integrators to a summer 42 (an alternate topology might sum the delta-sigma input with the output of the last integrator stage). The output of summer 42 is connected to a variable-level quantizer 44 whose output is combined with the input signal at an invert adder 48. The output of variable-level quantizer 44 is the output of delta-sigma modulator 30 and may be fed to the input of a PWM encoder. In an exemplary embodiment wherein the DAC is used in an audio circuit, the output signal would be further fed to a gain amplifier and a speaker, headphones, ear plug, etc.

Figures 5A, 5B:
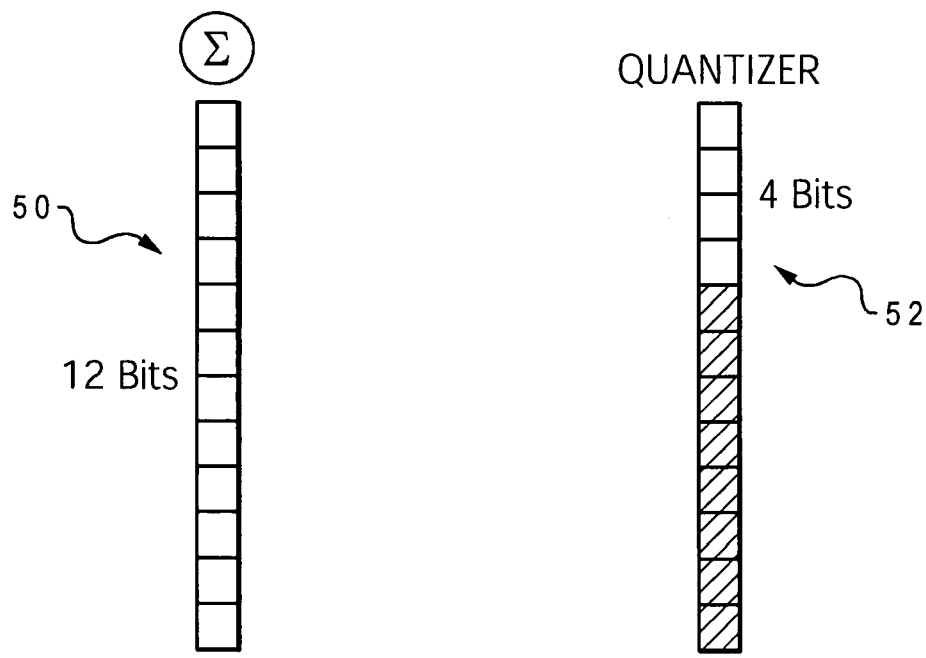
FIGS. 5A and 5B are block diagrams of registers for the summer and the quantizer shown in the delta-sigma modulator of FIG. 4A and illustrate in one implementation of the present invention the operation of the summer output truncating but not clipping to provide a smoother ramp up signal.

Referring now to FIGS. 5A and 5B, in the fixed-point implementation shown, the output 50 of summer 42 is a 12-bit value, but, in alternative implementations, the number of bits could be more or less than 12. For this implementation, the output 52 of quantizer 44 is a 4-bit value. The most significant bits are at the top of the register stacks in FIGS. 5A and 5B.

Quantizer 44 quantizes the summer output 50 to a smaller number of levels. In the illustrative embodiment, quantizer 44 derives an output value between −6 and +6 in normal operation, that is, after ramp up of the delta-sigma modulator. Quantization is achieved by truncating summer output 50 to the four most significant bits and then clipping this value to force the output within the allowed range of −6 to +6. The range of the input to the delta-sigma modulator is set such that clipping at the quantizer and the excess quantization noise which this would introduce are kept to a minimum. For example, if the top four bits of summer output 50 are "0111" (+7), then quantizer 44 would alter the value to the appropriate legal value of "0110" (+6). Similarly, if the top four bits of summer output 50 are "1000" (−8) or "1001" (−7), then (during normal operation) quantizer 44 would alter those values to the next closest legal value of "1010" (−6). These exemplary values are for a two's complement arithmetic implementation, but the inventive concept applies to other implementations as well.

Figure 1:
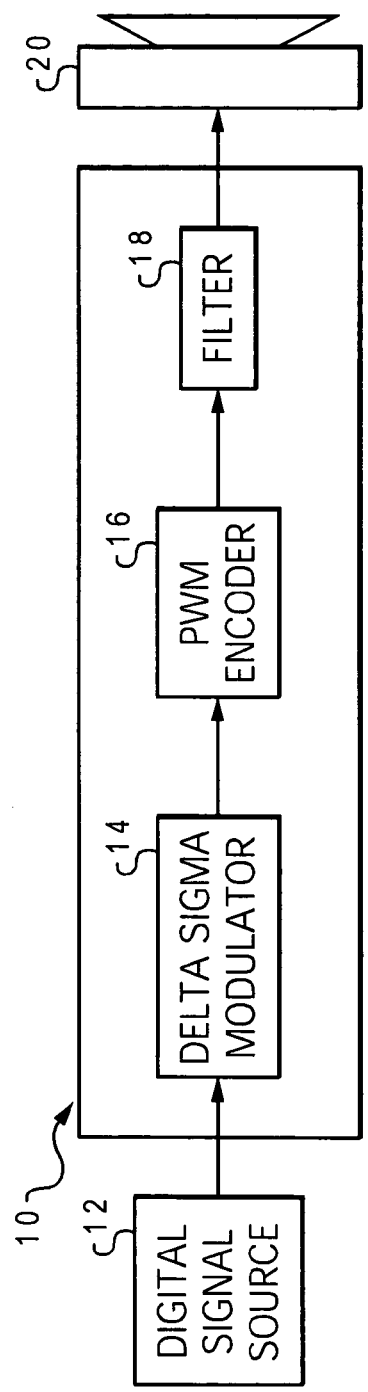
FIG. 1 is a block diagram of a conventional digital-to-analog converter, which utilizes a delta-sigma modulator and pulse-width modulation encoding.
Figure 2:
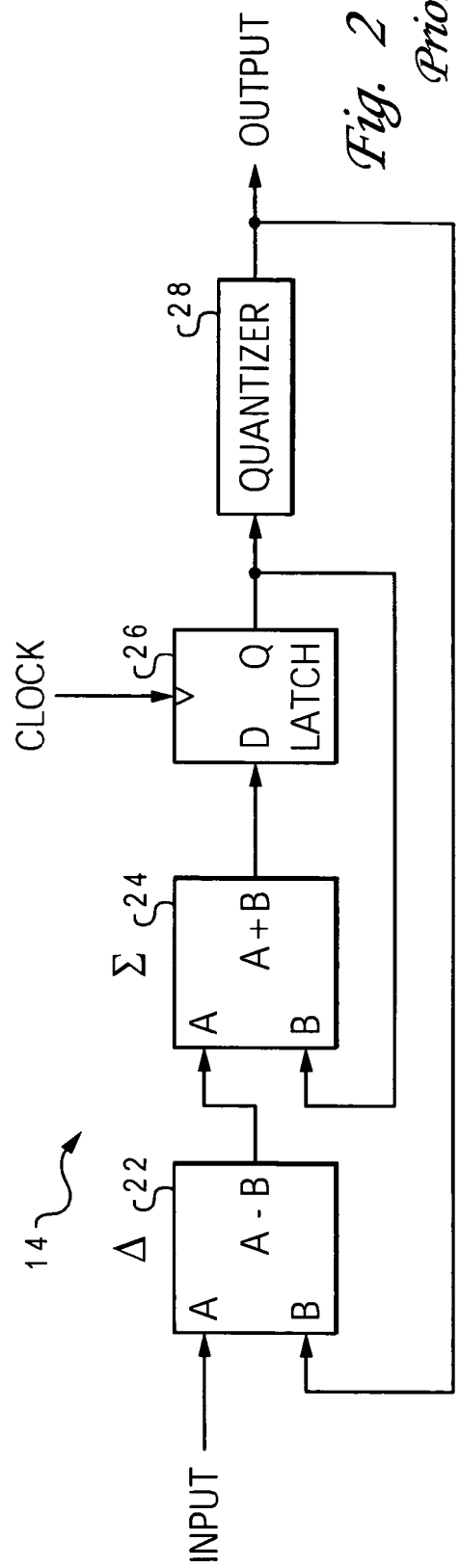
FIG. 2 is a block diagram of a conventional delta-sigma modulator, which uses a quantizer to convert a multibit high-resolution digital signal into a multi-bit or single-bit representation which can be further converted to an analog signal.
Figure 3:
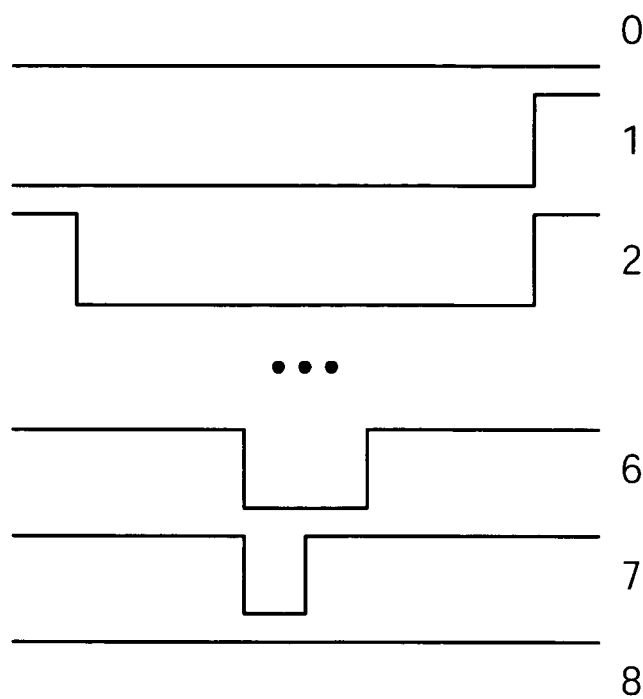
FIG. 3 is a timing diagram illustrating nine different possible signals for pulse-width modulation (PWM) encoding using an 8-clock wide signal.

Clipping the output of quantizer 44 to a narrower range keeps the quantizer output within the legal set of allowed signals for pulse width modulation as discussed in relation to FIG. 3, which is required in order to maintain the constant edge rate. The pulse width of the PWM signal must be large enough to ensure a sufficient number of clock cycles to properly encode the quantized value. For this implementation having quantizer levels ranging from −8 to +7, a PWM signal of at least 15 clock cycles is required.

The foregoing procedure of quantizer 44 is for normal operation (after ramp up), but, during ramp up, a different mode is selectively enabled for quantizer 44, which allows more quantizer levels. In the illustrative implementation, for ramp up operation, the output 50 of summer 42 is truncated to four bits but not clipped, thereby permitting values in the range of −8 to +7. Additionally, the order of the modulator can be lowered as taught in U.S. Pat. No. 6,556,159 to ensure stability at the higher modulation index. This technique effectively allows delta-sigma modulator 30 to achieve a higher modulation index for the ramp up sequence. During this ramp up, the input to the modulator is driven to a lower level than during normal operation, so a higher modulation index is achieved, but the quantization is no worse in normal operation when the modulator input range is scaled back down. By enabling the extra quantizer levels, the output drives nearly all negative full-scale PWM codes (−8s in the previous example) during ramp up, driving the output as low as possible and enabling a smooth ramp up to the common mode level. Enabling two additional quantizer levels at the low end of the range does violate the constant edge-rate goal of a PWM system, but since the effect of a variable edge-rate is distortion, and these additional quantizer levels are only allowed during the ramp-up, which is effectively a DC signal, no adverse consequences generally exist to violating this requirement during power up.

Figure 6:
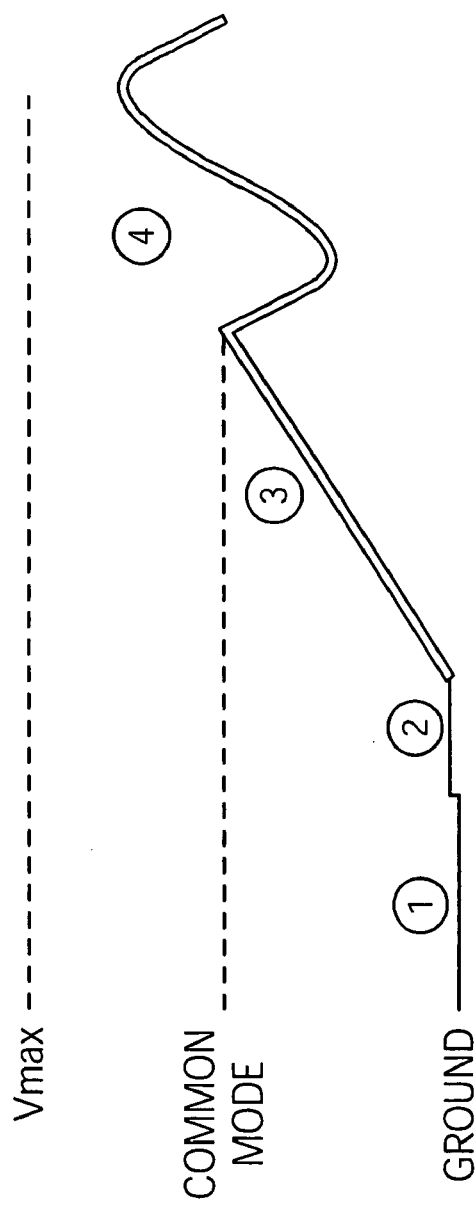
FIG. 6 is a timing diagram showing the behavior of an output signal during a ramp up sequence when using the present invention.

FIG. 6 depicts a time-domain plot of the behavior of the output of a DAC utilizing delta-sigma modulator 30 during the ramp up sequence, indicating when the extra quantizer levels are enabled and when they are disabled. During the first time period $t_1$, the output is clamped to ground. The second time period $t_2$ begins when the clamp is released and the amplifier begins to drive the output. During the third time period $t_3$, the output voltage begins to ramp up from near ground to the common mode voltage, i.e., the mid-level voltage between ground and the maximum signal voltage ($V_{max}$). The extra quantizer levels are enabled during this third time period $t_3$. The final time period $t_4$ represents normal operation of the unit, and the extra quantizer levels are disabled during such normal operation to guarantee a constant edge rate in the PWM output. The present invention thus facilitates an all-digital ramp up for a PWM-based DAC. No additional gain stages are required in the analog back end stages. The previous analog gain solution introduced audible artifacts when the gain stage was disabled at the end of the ramp.

Figure 7:
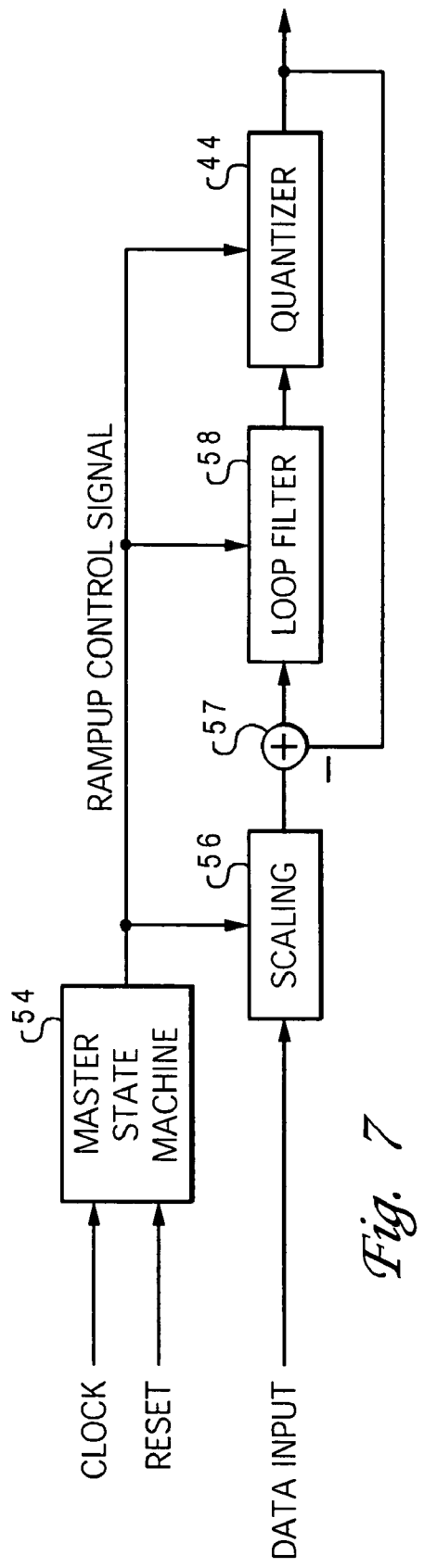
FIG. 7 is a block diagram depicting one embodiment of a variable-level quantizer constructed in accordance with the present invention for use in the delta-sigma modulator of FIG. 4.

Control of the quantization level may be accomplished in a variety of ways. One approach is shown in FIG. 7. A state machine 54 receives the clock signal and a reset signal and activates a ramp up control signal only during the ramp up period. The ramp up control signal enables extended-level operation of a scaling unit 56, a loop filter 58, and quantizer 44. The data input from summer 42 is fed into scaling unit 56 which scales the values and passes it onto loop filter 56. A feedback signal from quantizer 44 is combined with the input of loop filter 58 by an invert adder 57.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of operating a multibit delta-sigma modulator, comprising the steps of:
   generating a plurality of integrator outputs from an input signal;
   calculating a sum whose inputs are selected from the integrator outputs and the input signal; and
   deriving a quantized value from the sum, said deriving step including the step of selectively enabling an additional quantizer level during a ramp up sequence of the modulator.

2. The method of claim 1, further comprising the step of feeding the quantized value to an input of a pulse width modulation encoder.

3. The method of claim 1, wherein the additional quantizer level is disabled during normal operation of the modulator.

4. The method of claim 1, wherein said deriving step includes the step of truncating the sum.

5. The method of claim 4, wherein said deriving step further includes the step of clipping a truncated sum within a first range of quantizer levels during the ramp up sequence and within a second range of quantizer levels during normal operation, wherein more quantizer levels are in said first range than in said second range.

6. The method of claim 1, wherein said enabling step enables at least two additional quantizer levels at a low end of a quantizer range.

7. The method of claim 6, wherein:
   the range of quantizer levels for normal operation of the modulator is from −6 to +6; and
   the range of quantizer levels for ramp up operation of the modulator is from −8 to +7.

8. A variable-level quantizer, comprising:
   an input for receiving a value from a summer;
   a truncation circuit which provides a quantized value based on a plurality of most significant bits of the summer value; and
   a clipping circuit which selectively adjusts the quantized value within a first range of quantizer levels during a ramp up sequence and within a second range of quantizer levels during normal operation, wherein more quantizer levels are in said first range than in said second range.

9. The variable-level quantizer of claim 8, further comprising an output connected to said clipping circuit, said output being adapted for interconnection to an input of a pulse-width modulation encoder.

10. The variable-level quantizer of claim 8, wherein:
    said input is adapted to receive a 12-bit summer value; and
    said truncation circuit provides a 4-bit quantized value.

11. The variable-level quantizer of claim 8, wherein said first range of quantizer levels enables at least two additional quantizer levels from a low end of said second range.

12. The variable-level quantizer of claim 11, wherein:
    the first range of quantizer levels for ramp up operation is from −8 to +7; and
    the second range of quantizer levels for normal operation is from −6 to +6.

13. A delta-sigma modulator comprising:
    an input;
    a plurality of integrators connected to said input, said integrators having respective outputs;

a summer which adds a selection of the integrator outputs and the input to yield a summer output; and a quantizer which quantizes the summer output, said quantizer selectively enabling an additional quantizer level during a ramp up sequence of the modulator.

14. The delta-sigma modulator of claim 13, wherein the additional quantizer level is disabled during normal operation of the modulator.

15. The delta-sigma modulator of claim 13, wherein said quantizer truncates the summer output.

16. The delta-sigma modulator of claim 13, wherein said quantizer further clips a truncated sum within a first range of quantizer levels during the ramp up sequence and within a second range of quantizer levels during normal operation, wherein more quantizer levels are in said first range than in said second range.

17. The delta-sigma modulator of claim 16, wherein said first range of quantizer levels enables at least two additional quantizer levels from a low end of said second range.

18. The delta-sigma modulator of claim 17, wherein:
the first range of quantizer levels for ramp up operation is from −8 to +7; and
the second range of quantizer levels for normal operation is from −6 to +6.

19. A digital-to-analog converter, comprising:
an input for receiving a digital signal;
a delta-sigma modulator connected to said input, said delta-sigma modulator using a variable-level quantizer which selectively enables an additional quantizer level during a ramp up sequence of the modulator; and
a pulse-width modulation encoder which generates a pulse-modulated signal based on an output from said variable-level quantizer.

20. The digital-to-analog converter of claim 19, further comprising a low-pass filter connected to said pulse-width modulation encoder.

21. The digital-to-analog converter of claim 19, wherein said variable-level quantizer selectively enables at least two additional quantizer levels at a low end of a quantizer range.

22. The digital-to-analog converter of claim 19, wherein said variable-level quantizer provides a 4-bit quantized value.

* * * * *